（12）United States Patent
Yeh

(10) Patent No.: US 8,586,469 B2
(45) Date of Patent: Nov. 19, 2013

(54) METAL LAYER END-CUT FLOW

(75) Inventor: Chen-Hao Yeh, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 478 days.

(21) Appl. No.: 12/845,448

(22) Filed: Jul. 28, 2010

(65) Prior Publication Data

US 2012/0028457 A1    Feb. 2, 2012

(51) Int. Cl.
*H01L 21/4763*    (2006.01)

(52) U.S. Cl.
USPC 438/618; 438/669; 257/E21.59; 257/E21.589; 257/E21.575; 257/E21.579

(58) Field of Classification Search
USPC ............ 438/618, 669; 257/E21.59, E21.589, 257/E21.575, E21.579
See application file for complete search history.

(56) References Cited

U.S. PATENT DOCUMENTS 6,440,838 B1 *  8/2002  Lui et al. .................... 438/618

* cited by examiner

*Primary Examiner* — Stephen W Smoot
*Assistant Examiner* — Vicki B Booker
(74) *Attorney, Agent, or Firm* — Haynes and Boone, LLP

(57) ABSTRACT

A method of patterning a metal layer is disclosed. The method includes providing a substrate and forming a material layer over the substrate. The method includes forming a second material layer over the first material layer. The method includes performing a first patterning process to the second material layer to form a trench in the second material layer. The first patterning process defines a width size of the trench, the width size being measured in a first direction. The method includes performing a second patterning process to the trench to transform the trench. The second patterning process defines a length size of the transformed trench. The length size is measured in a second direction different from the first direction. The method also includes filling the transformed trench with a conductive material.

20 Claims, 11 Drawing Sheets

Cross-sectional View

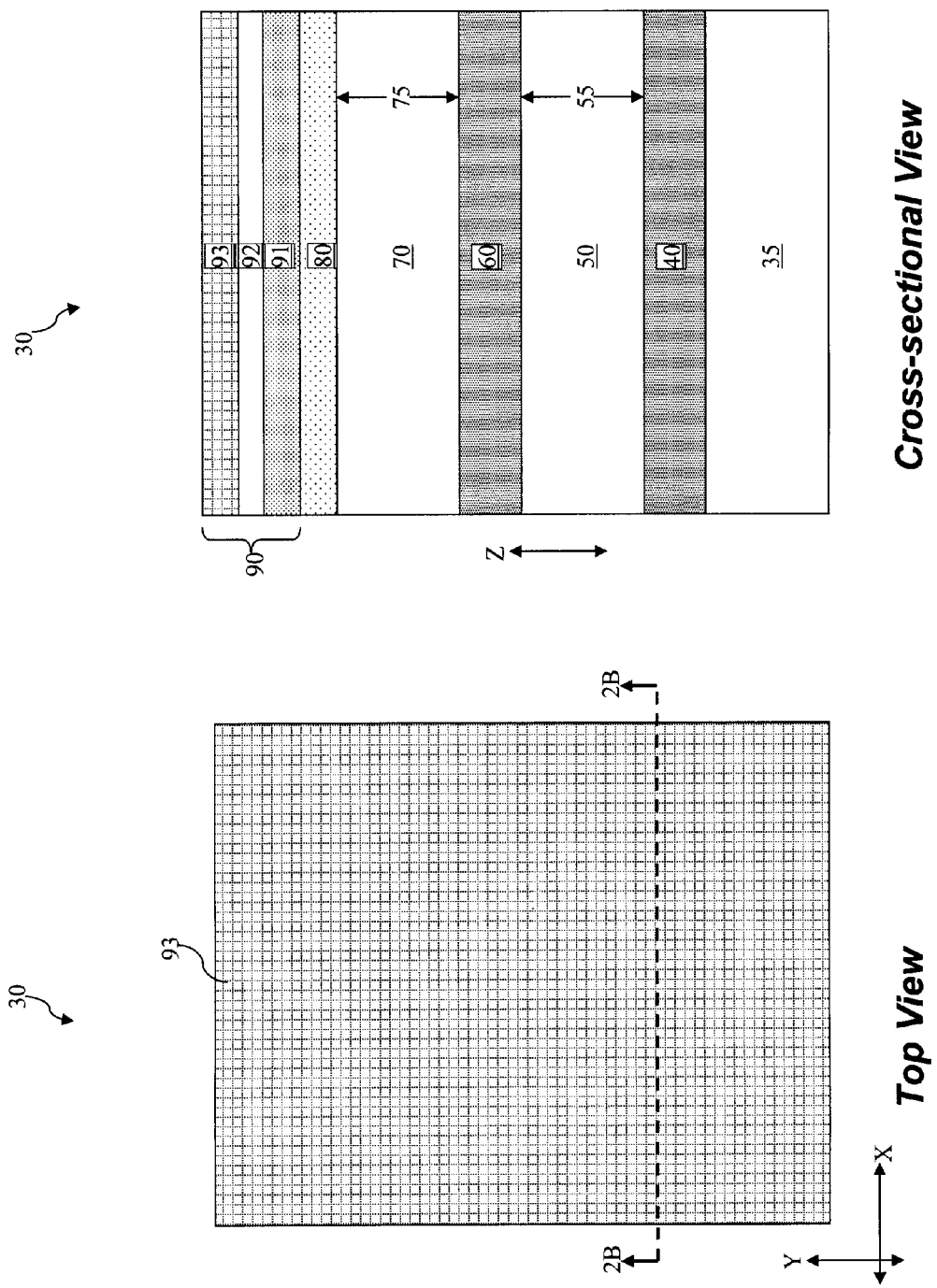
Fig. 2B Cross-sectional View
Fig. 2A Top View

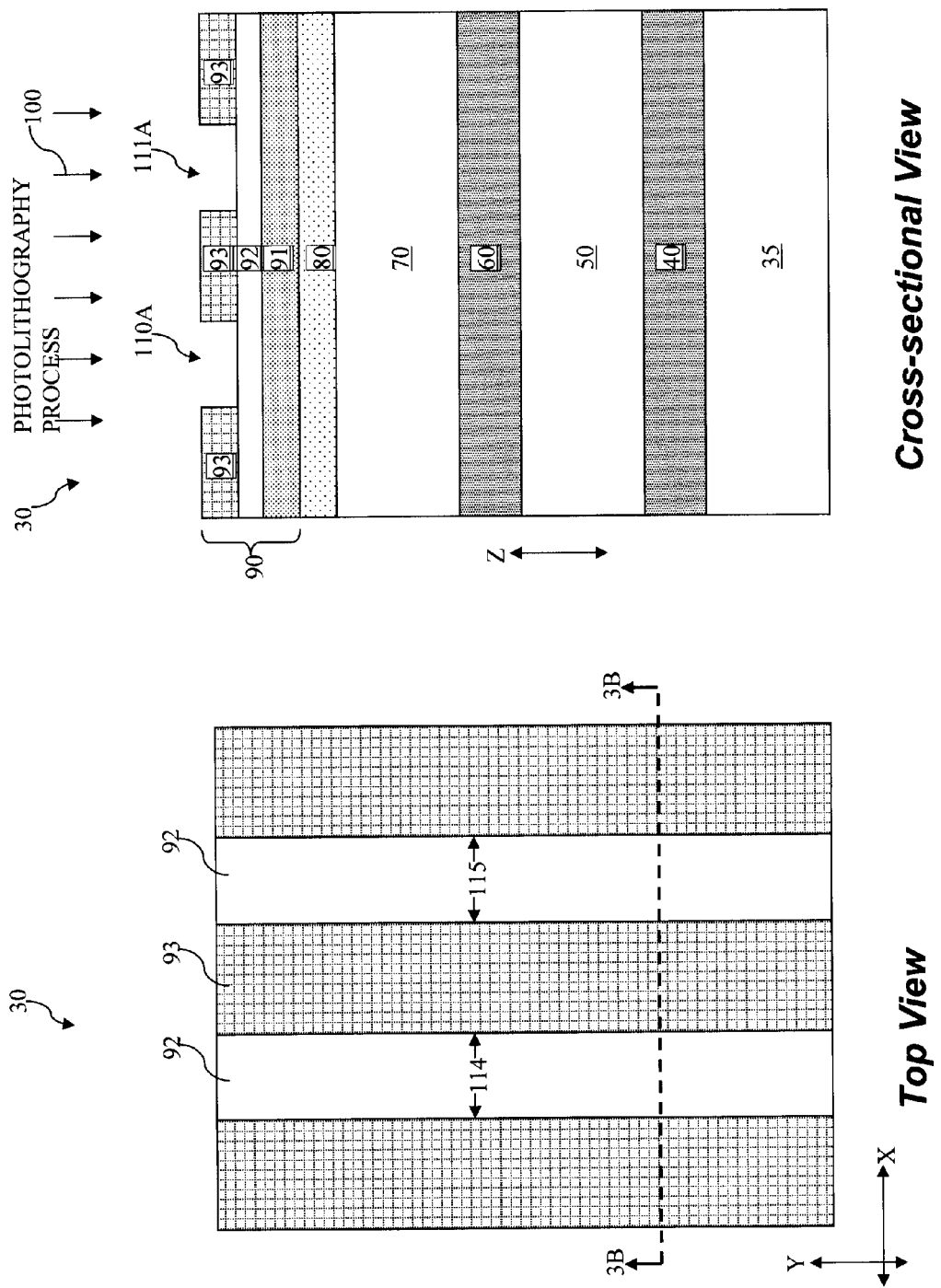

Cross-sectional View

Top View

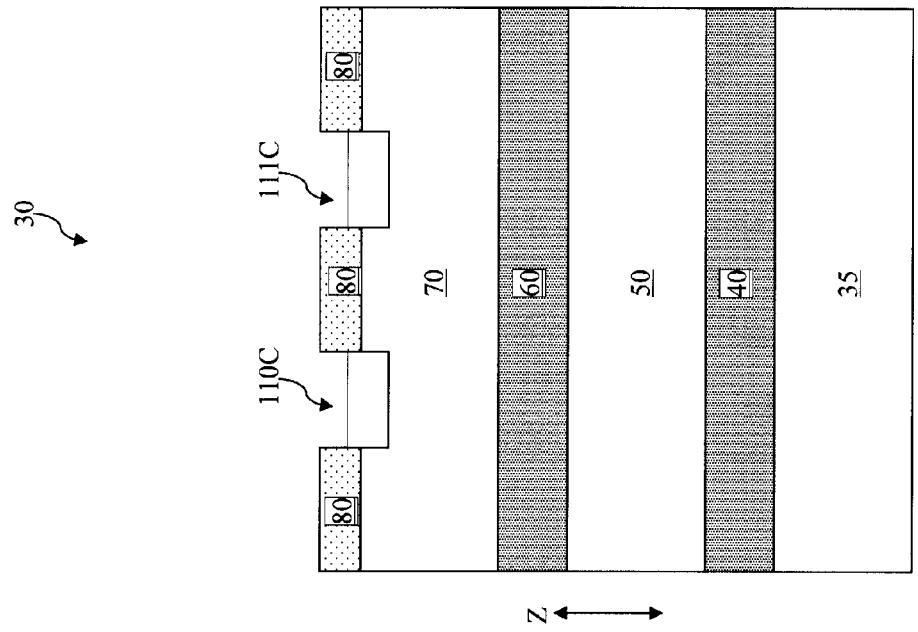
Fig. 5B Cross-sectional View
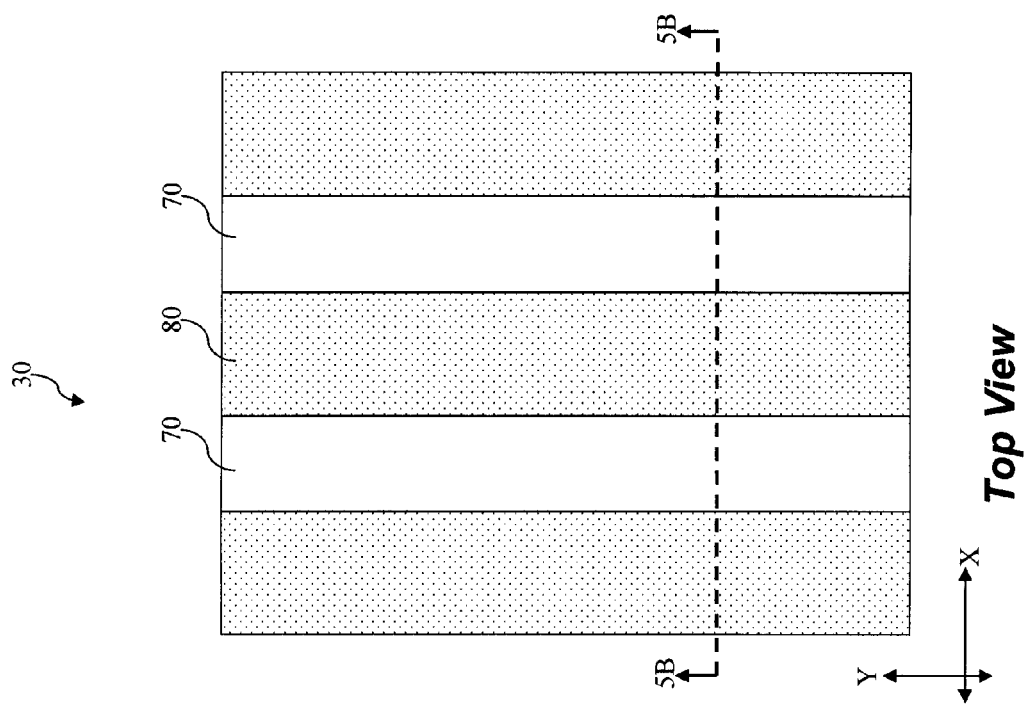
Fig. 5A Top View

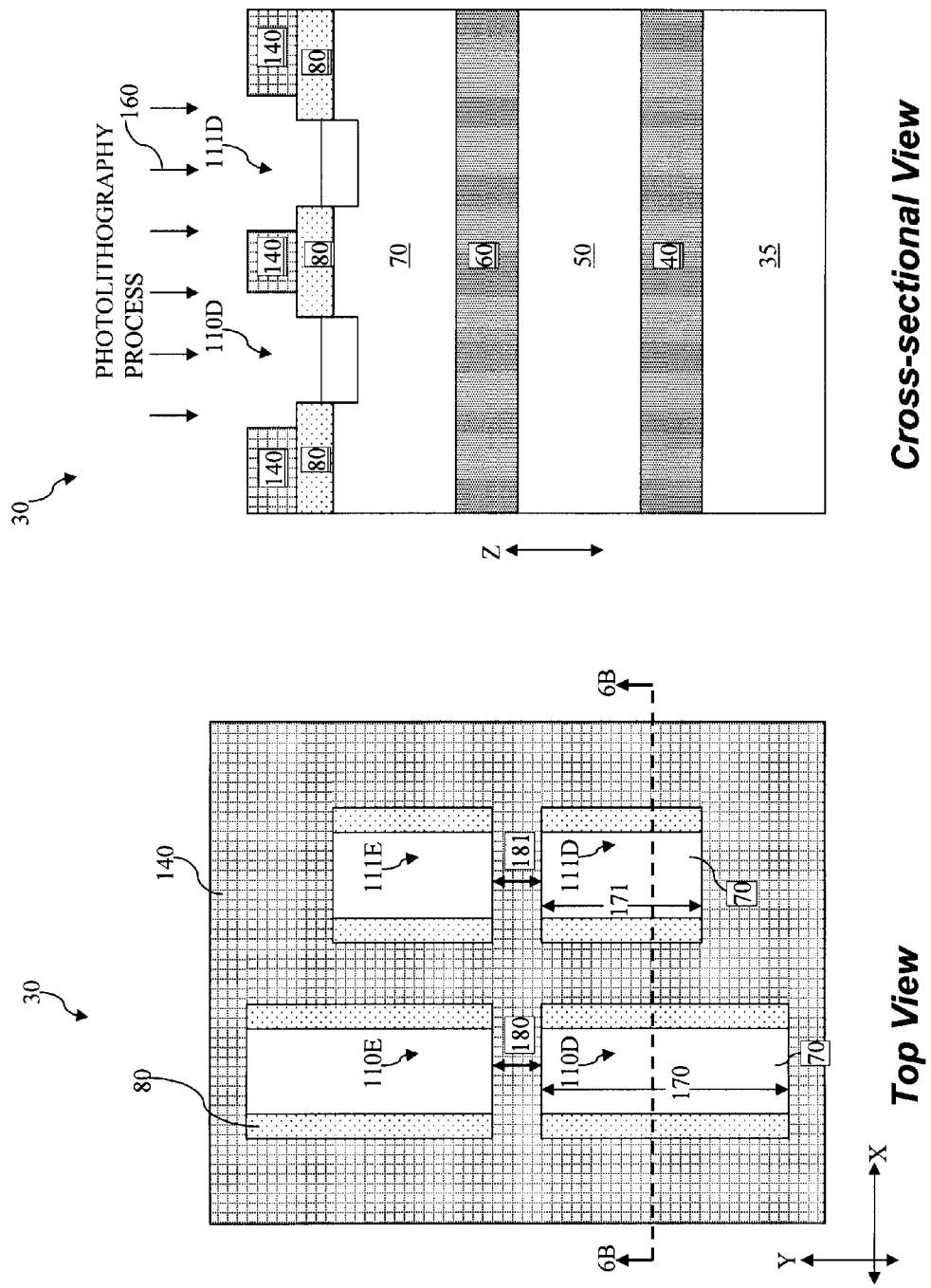

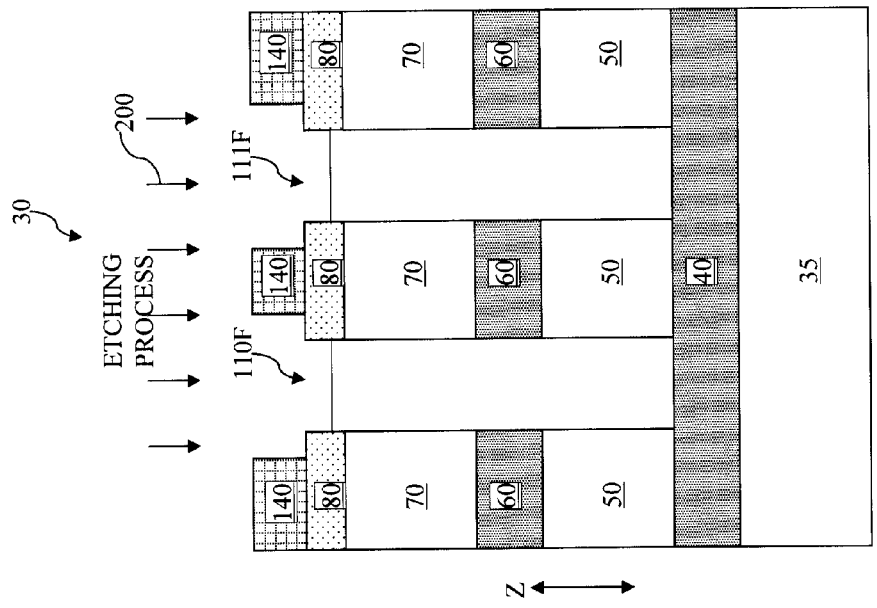
Fig. 7B Cross-sectional View
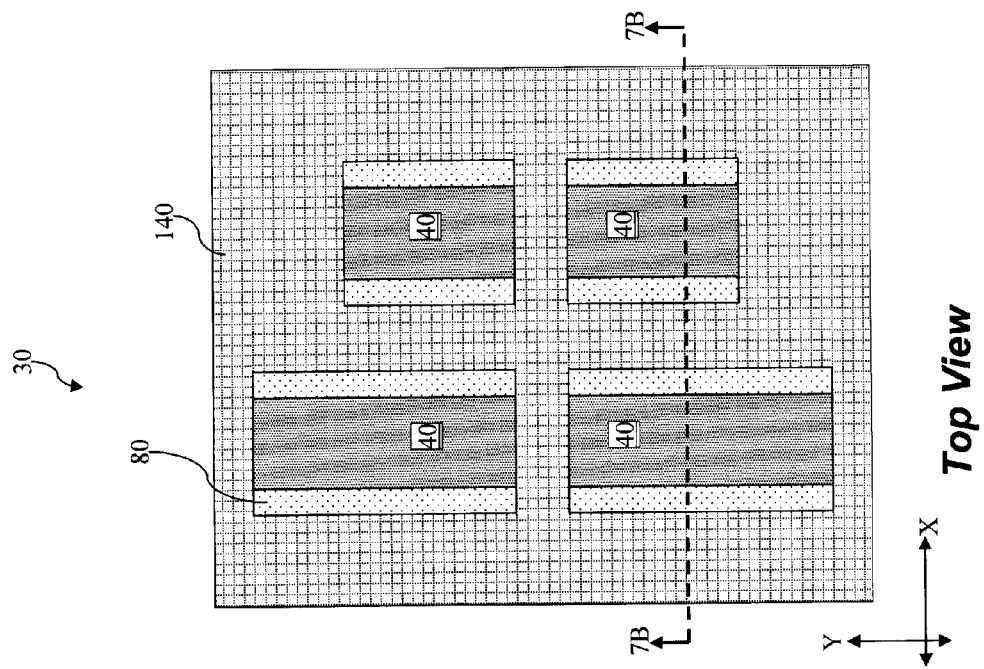
Fig. 7A Top View

Cross-sectional View

Top View

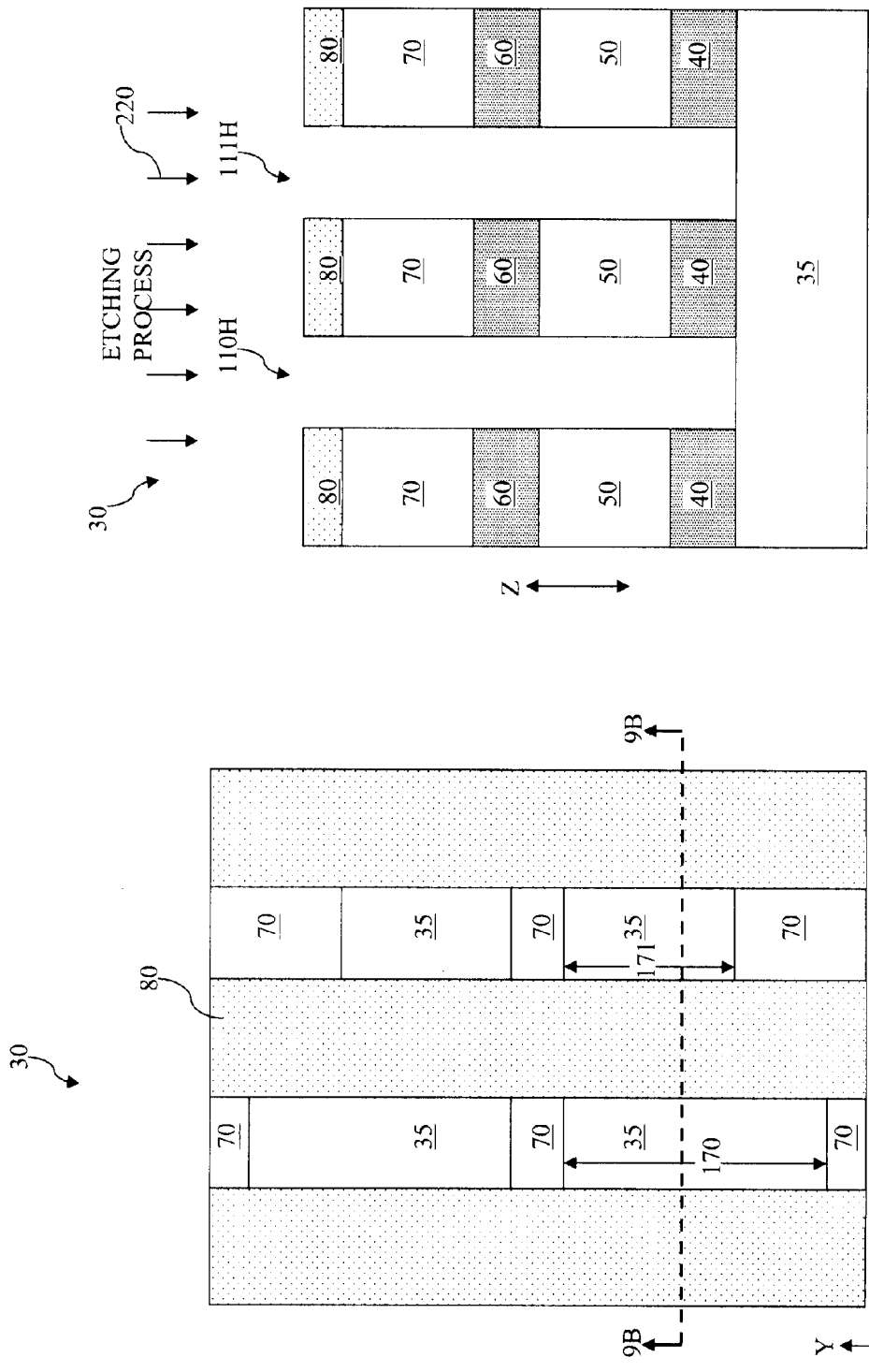

Cross-sectional View

Top View

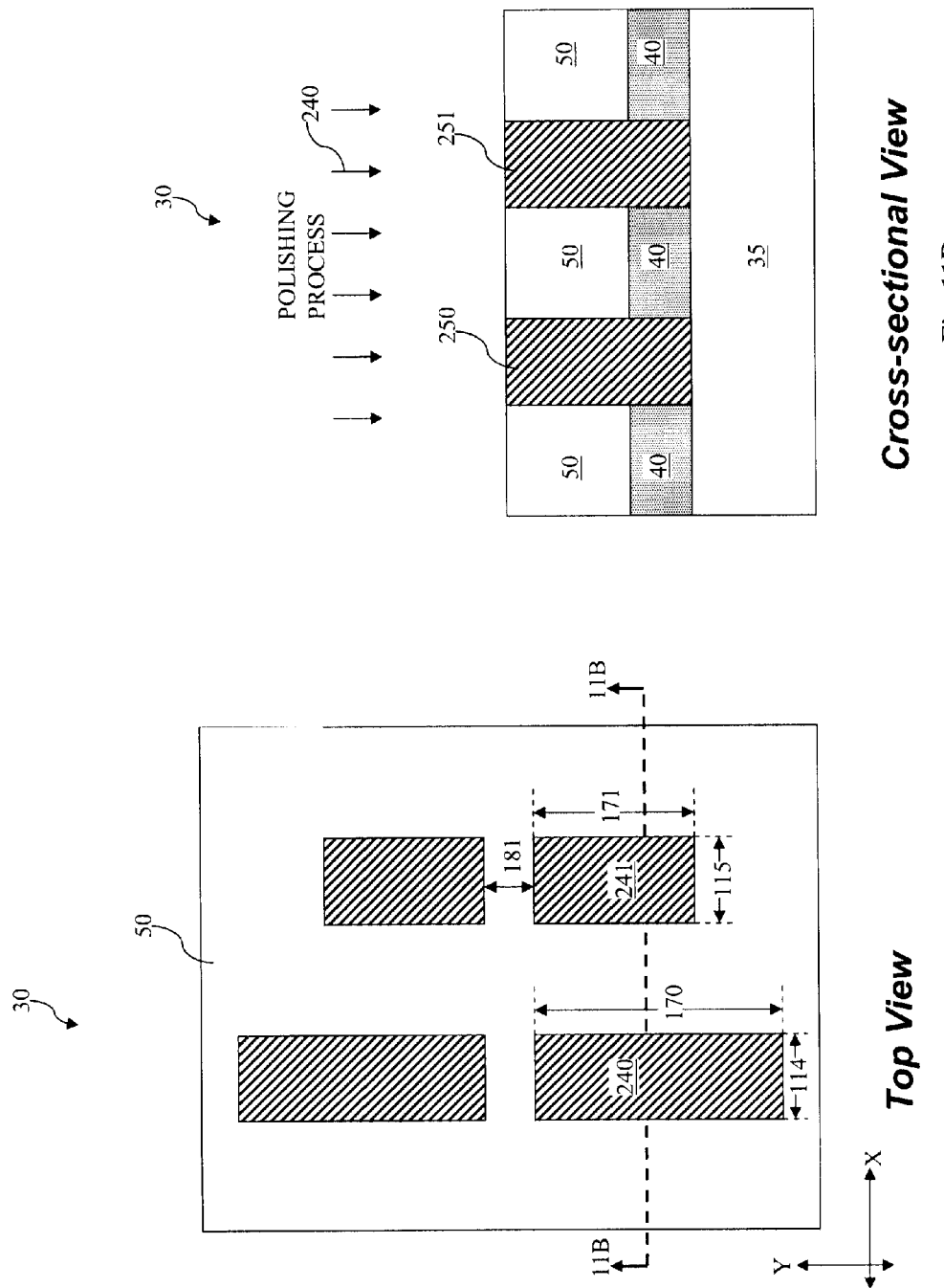

METAL LAYER END-CUT FLOW

TECHNICAL FIELD

The present disclosure relates generally to a method of patterning a semiconductor device, and more particularly, to the patterning of a metal layer of a semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As a result, with current patterning techniques, different pattern on the same wafer may have large critical dimension (CD) variations. Also, end-to-end spacing may become unacceptably large.

Therefore, while existing methods of patterning semiconductor devices have been generally adequate for their intended purposes, they have not been entirely satisfactory in every aspect.

SUMMARY

One of the broader forms of the present disclosure involves a semiconductor device. The semiconductor device includes: a substrate; an interconnect structure formed over the substrate, the interconnect structure having a plurality of interconnect layers; and a first conductive feature and a second conductive feature both formed in the same one of the interconnect layers, first and second conductive features having respective first and second lengths measured in a first direction and respective first and second widths measured in a second direction different from the first direction; wherein: the first and second lengths are different; and the first and second widths are approximately the same.

Another one of the broader forms of the present disclosure involves a method. The method includes: providing a substrate; forming a first material layer over the substrate; forming a second material layer over the first material layer; performing a first patterning process to the second material layer to form a trench in the second material layer, the first patterning process defining a width size of the trench, the width size being measured in a first direction; performing a second patterning process to the trench to transform the trench, the second patterning process defining a length size of the transformed trench, the length size being measured in a second direction different from the first direction; and filling the transformed trench with a conductive material.

Yet another one of the broader forms of the present disclosure involves a method. The method includes: providing a substrate; forming a material layer over the substrate; performing a first patterning process to the material layer to form first and second openings in the material layer, the first and second openings each having an elongate shape and extending in the first direction, the first and second openings having respective first and second lengths measured in the first direction and respective first and second widths measured in a second direction that is substantially perpendicular to the first direction, the first and second widths being approximately same; performing a second patterning process to the material layer to form a third opening based on the first opening and a fourth opening based on the second opening, the third and fourth openings having respective third and fourth lengths that are different from each other, and wherein the third and fourth openings have respective third and fourth widths that are approximately equal to the first and second widths, respectively; and filling the third and fourth openings with a conductive material.

BRIEF DESCRIPTION OF THE DRAWINGS

The present disclosure is understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-11A are diagrammatic fragmentary top level views of a portion of a semiconductor device at different stages of fabrication in accordance with aspects of the present disclosure.

FIGS. 2B-11B are diagrammatic fragmentary cross-sectional side views of the portion of the semiconductor device of FIGS. 2A-11A at different stages of fabrication in accordance with aspects of the present disclosure.

DETAILED DESCRIPTION

Figure 1:
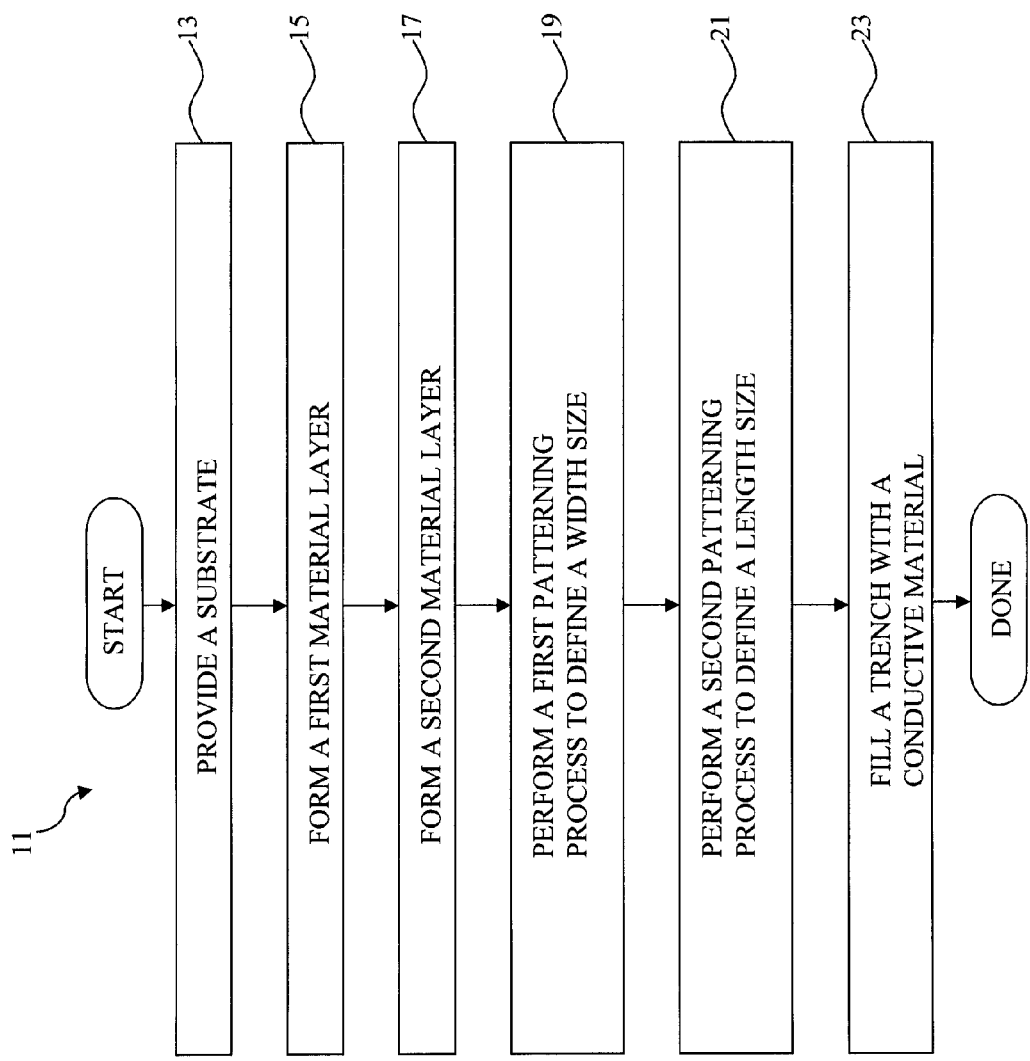
FIG. 1 is a flow chart of a method for patterning a semiconductor device in accordance with aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 11 for patterning a semiconductor device. The method 11 begins with block 13 in which a substrate is provided. The method continues with block 15 in which a first material layer is formed over the substrate. The method continues with block 17 in which a second material layer is formed over the first material layer. The method continues with block 19 in which a first patterning process is performed to the second material layer to form a trench in the second material layer. The first patterning process defines a width size of the trench. The width size is measured in a first direction. The method continues with block 21 in which a second patterning process is performed to transform the trench. The second patterning process defines a length size of the transformed trench. The length size is measured in a second direction that is different from the first direction. The method continues with block 23 in which the transformed trench is filled with a conductive material.

FIGS. 2A-11A are diagrammatic fragmentary top level views of a portion of a semiconductor device 30 during various patterning stages in accordance with an embodiment of the method 11 described in FIG. 1. FIGS. 2A-11A are two-dimensional views, wherein the two dimensions respectively extend along an X axis and a Y axis perpendicular to the X axis. FIGS. 2B-11B are diagrammatic fragmentary cross-sectional side views of the portion of the semiconductor device 30 observed in a direction that is along the Y axis. Alternatively stated, the cross-section is cut in the direction along the X axis. The various forming and etching processes (discussed later) performed on the semiconductor device 30 are done along a Z axis that is perpendicular to an imaginary plane formed by the X axis and the Y axis.

The semiconductor device 30 may be a portion of an integrated circuit (IC) chip and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-11 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIGS. 2A and 2B, the semiconductor device 30 includes a substrate 35. The substrate 35 may be a semiconductor wafer, or may be an under-layer such as a metal layer ($M_x$ to $M_{x+1}$). For example, the substrate 35 may include silicon. The substrate 35 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 35 may include a non-semiconductor material such as a glass substrate for thin-film-transistor liquid crystal display (TFT-LCD) devices, or fused quartz or calcium fluoride for a photomask (mask). The substrate 35 may include various doped regions and/or dielectric features for various microelectronic components, such as a complementary metal-oxide-semiconductor field-effect transistor (CMOSFET), imaging sensor, memory cell, and/or capacitive element.

A liner layer 40 is formed over the substrate 35. The liner layer 40 is formed by a suitable process such as physical vapor deposition (PVD), sputtering, chemical vapor deposition (CVD), or combinations thereof. The liner layer 40 includes a silicon nitride material in the present embodiment, but may include another suitable material in alternative embodiments.

A dielectric layer 50 is formed over the liner layer 40. The dielectric layer 50 is formed by a process such as PVD, CVD, sputtering, or another suitable technique. The dielectric layer 50 includes an oxide material (for example, silicon oxide) in the present embodiment, but may include another suitable material in alternative embodiments. The dielectric layer 50 has a thickness 55 that is in a range from approximately 300 Angstroms to approximately 1000 Angstroms.

A liner layer 60 is optionally formed over the dielectric layer 50. The liner layer 60 is formed by a process such as PVD, CVD, sputtering, or another suitable technique. The liner layer 60 includes a silicon nitride material in the present embodiment, but may include another suitable material in alternative embodiments.

A dielectric layer 70 is formed over the liner layer 60. The dielectric layer 70 is formed by a process such as PVD, CVD, sputtering, or another suitable technique. The dielectric layer 70 includes an oxide material (for example, silicon oxide) in the present embodiment, but may include another suitable material in alternative embodiments. The dielectric layer 70 has a thickness 75 that is in a range from approximately 500 Angstroms to approximately 1500 Angstroms.

A hard mask layer 80 is then formed over the dielectric layer 70. The hard mask layer 80 is formed by a process such as PVD, CVD, sputtering, or another suitable technique. The hard mask layer 80 includes a nitride material (for example, silicon nitride or titanium nitride) in the present embodiment, but may include another suitable material in alternative embodiments.

A tri-layer photoresist 90 is then formed over the hard mask layer 80. In the present embodiment, the tri-layer photoresist 90 includes a bottom photoresist layer 91, a spin-on Anti-Reflective Coating (ARC) layer 92, and a top photoresist layer 93. It is understood that in other embodiments, one or more layers of the tri-layer photoresist may be omitted, or additional layers may be provided as a part of the tri-layer photoresist, and the layers may be formed in difference sequences.

Referring now to FIGS. 3A and 3B, a photolithography process 100 is performed to the tri-layer photoresist 90 to pattern the photoresist layer 93. The photolithography process 100 may include various masking, exposing, baking, and rinsing processes. The photoresist layer 93 is patterned to have elongate trenches (or openings) therein, two of which are shown in FIGS. 3A and 3B as trenches 110A and 111A. The trenches 110A and 111A extend in a direction defined by the Y axis (also referred to as a Y direction). The trenches 110A and 111A have respective widths 114 and 115 that are measured in the direction defined by the X axis (also referred to as an X direction). The photolithography process 100 is carried out in a manner so as to precisely define the widths 114 and 115. In the present embodiment, the widths 114 and 115 are substantially equal to one another. Alternatively stated, the widths 114 and 115 have a ratio that is approximately 1:1.

Figure 4B:
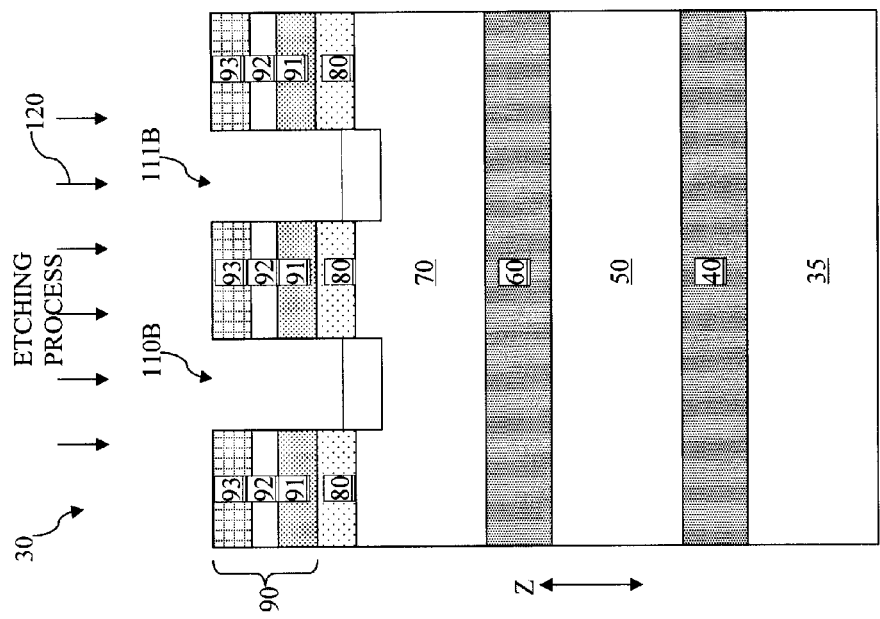
Figure 4A:
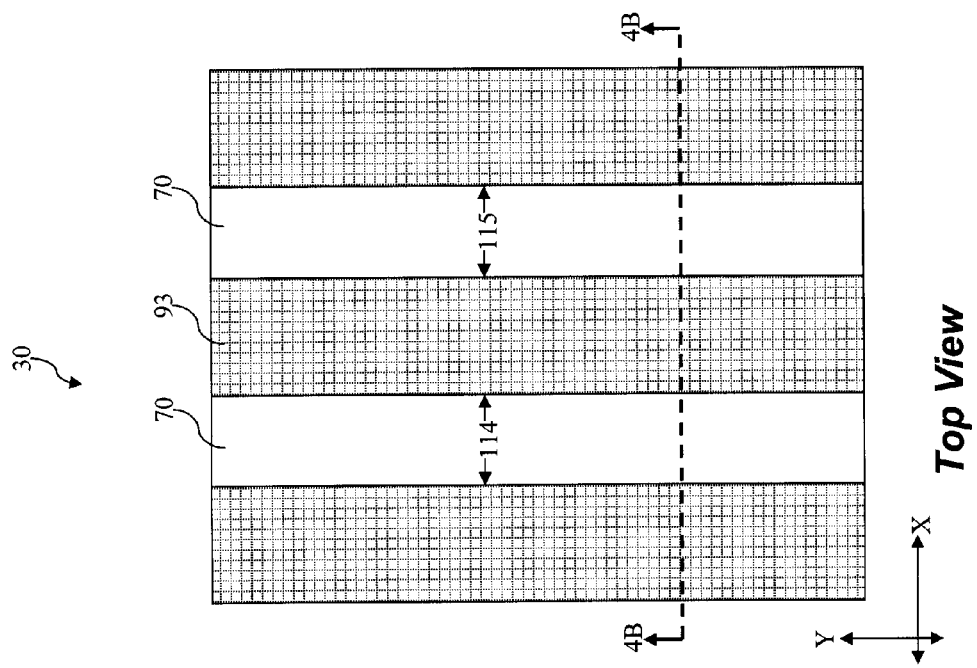

Referring now to FIGS. 4A and 4B, an etching process 120 is then performed on the tri-layer photoresist 90 to partially etch the trenches 110A and 111A downwards in a direction defined by the Z axis (also referred to as a Z direction) until a portion of the dielectric layer 70 has been etched away. In other words, the trenches 110A and 111A are extended downwards to become trenches 110B and 111B, respectively. The etching process 120 may be a suitable etching process known in the art, such as a dry etching process or a wet etching process. The photolithography process 100 and the etching process 120 may be collectively viewed or considered as a first patterning process. This first patterning process defines the widths 114 and 115 of their respective trenches 110B and 111B.

At this stage of fabrication, portions of the dielectric layer 70 that were previously covered up by the tri-layer photoresist 90 are now exposed by the trenches 110B and 111B. This can be observed from the top level view in FIG. 4A.

Referring now to FIGS. 5A and 5B, the tri-layer photoresist 90 (shown in FIGS. 3A-3B and 4A-4B) are removed in a photoresist removal process known in the art, such as a stripping process or an ashing process. At this stage of fabrication, portions of the hard mask layer 80 that were previously covered up by the tri-layer photoresist 90 are now exposed and observable from the top view in FIG. 5A. The trenches 110B and 111B now become trenches 110C and 111C, respectively.

Referring now to FIGS. 6A and 6B, another patterned photoresist layer 140 is formed over the hard mask layer 80 by a photolithography process 160. The photoresist layer 140 may be a single layer photoresist or a multi-layer photoresist. The photolithography process 160 may include various deposition, masking, exposing, baking, rinsing, and dry development processes. The patterned photoresist layer 140 separates (or cuts) the trench 110C into elongate trenches 110D and 110E, and separates the trench 111C into elongate trenches 111D and 111E. Since FIG. 6B is a cross-sectional view of the semiconductor device 30 taken along one plane in the Z direction, only the trenches 110D and 111D are observable in FIG. 6B, but the trenches 110E and 111E are observable from the top level view in FIG. 6A. The ensuing discussions will focus primarily on the trenches 110D and 111D (and their transformations), since they are observable in the following cross-sectional view Figures. However, it is understood that the ensuing discussions may be applicable to the trenches 110E and 111E (and their transformations) as well.

The trenches 110D and 111D have respective lengths 170 and 171 that are measured in the Y direction. The photolithography process 160 is carried out in a manner so as to precisely define the lengths 170 and 171. In the present embodiment, the length 170 is defined by the photolithography process 160 to be greater than the length 171. As such, the trench 110D may also be referred to as a long trench, and the trench 111D may also be referred to as a short trench.

The trenches 110D and 110E are separated by a distance 180, and the trenches 111D and 111E are separated by a distance 181. The distances 180 and 181 may be the same or may be different, depending on design rules. The distance 181 (or the distance 180) may also be referred to as an "end-to-end spacing." Compared to traditional processes, the end-to-end spacing (distance 181 or 180) may be defined to be quite small, whose exact size is constrained only by process and tool limitations of the photolithography process 160. This is one of the advantages of the embodiments disclosed herein and will be discussed in more detail later.

Referring now to FIGS. 7A and 7B, an etching process 200 is performed to etch the trenches 110D and 111D (shown in FIGS. 6A and 6B) further downwards in the Z direction until portions of the liner layer 40 located below the trenches 110D and 111D are exposed. In other words, the dielectric layers 70 and 50 and the liner layer 60 have been etched through, and the trenches 110D and 111D are extended into trenches 110F and 111F. The etching process 200 may be a suitable etching process known in the art, such as a dry etching process or a wet etching process. The patterned photoresist layer 140 and the hard mask layer 80 serve as protective masks during the etching process 200.

Figure 8B:
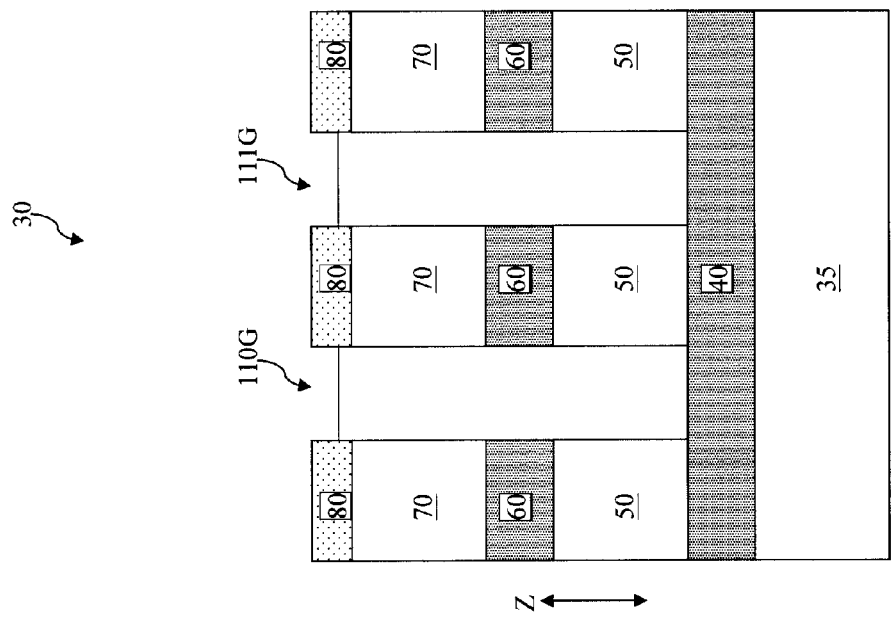
Figure 8A:
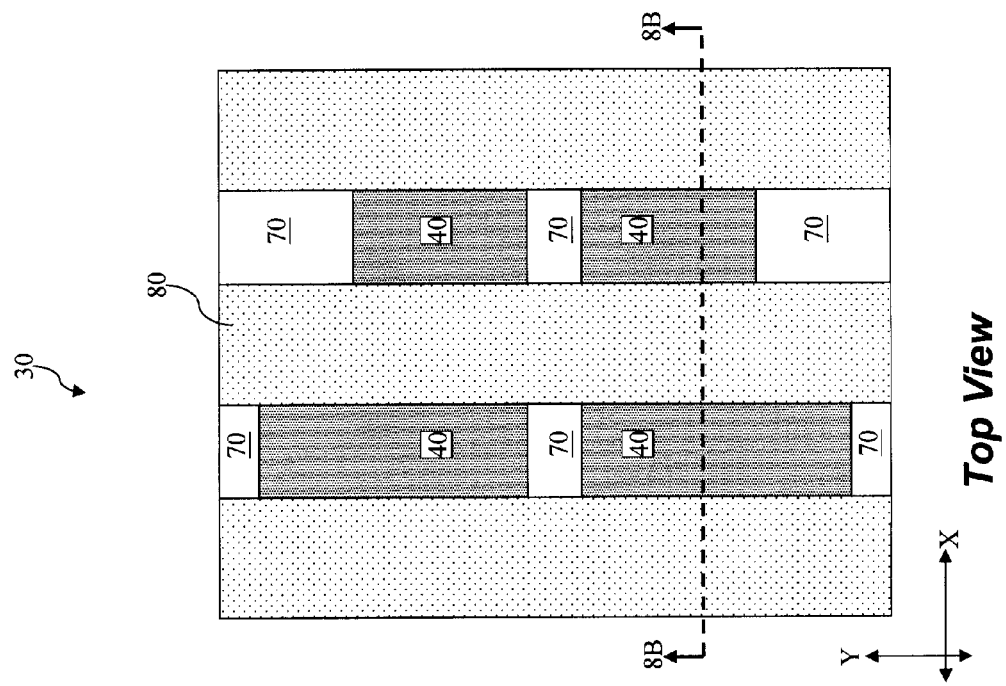

Referring now to FIGS. 8A and 8B, the patterned photoresist layer 140 (shown in FIGS. 6A-6B and 7A-7B) are removed in a photoresist removal process known in the art, such as a stripping process or an ashing process. At this stage of fabrication, portions of the hard mask layer 80 that were previously covered up by the patterned photoresist layer 140 are now exposed and observable from the top view in FIG. 5A. The trenches 110F and 111F now become trenches 110G and 111G, respectively. At this stage of fabrication, portions of the dielectric layer 70 are exposed and observable from the top view of FIG. 8A.

Referring now to FIGS. 9A and 9B, an etching process 220 is performed to etch the trenches 110G and 111G (shown in FIGS. 8A and 8B) further downwards in the Z direction until portions of the substrate 40 located below the trenches 110G and 111G are exposed. In other words, the liner layer 40 has been etched through, and the trenches 110G and 111G are extended into trenches 110H and 111H. The etching process 220 may be a suitable etching process known in the art, such as a dry etching process or a wet etching process. The hard mask layer 80 serves as a protective mask during the etching process 220. It is understood that the photolithography process 160 and the etching processes 200 and 220 may be collectively viewed or considered as a second patterning process. This second patterning process defines the lengths 170 and 171 of their respective trenches 110H and 111H.

Figure 10B:
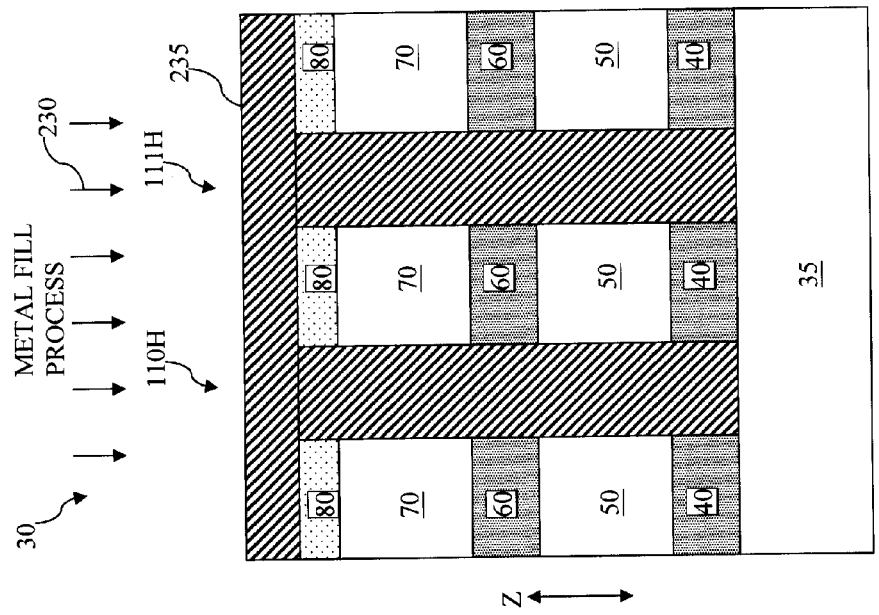
Figure 10A:
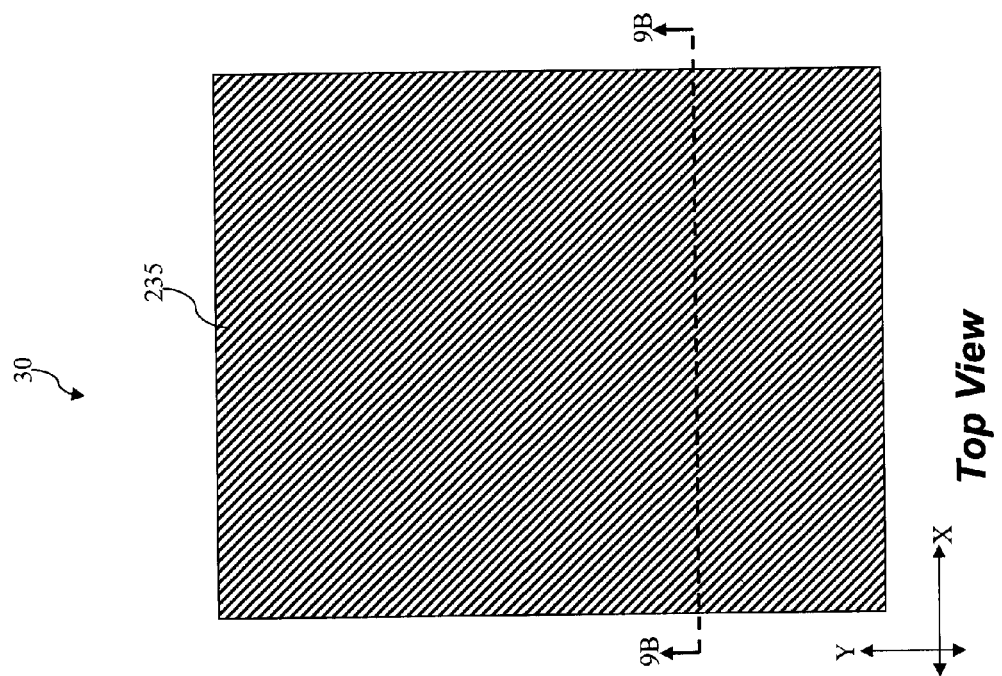

Referring now to FIGS. 10A and 10B, a metal fill process 230 is performed to fill the trenches 110H and 111H with a conductive material 235. The conductive material 235 may include a metal material, for example tungsten. At this stage of fabrication, the entire top plane of the semiconductor device 30 is covered by the conductive material 235. As such, only the conductive material 235 can be seen from the top view of FIG. 10A at this time.

Referring now to FIGS. 11A and 11B, a polishing process 240 is performed to remove the various layers above the dielectric layer 50, including portions of the conductive material 235. The remaining portions of the conductive material 235 form contacts/vias 250 and 251, respectively. In the present embodiment, the contacts/vias 250 and 251 reside in an M0 (metal-zero) metal layer of an interconnect structure. The interconnect structure is located above the substrate 35 and contains a plurality of metal layers filled with metal interconnects and vias/contact. It is understood that in other embodiments, the patterning processes described above may be applied to form the contacts/vias 250 and 251 in other metal layers of the interconnect structure.

The embodiments disclosed herein offer advantages compared to traditional processes. It is understood, however, that other embodiments may offer different advantages, and that no particular advantage is required for all embodiments.

One advantage offered by the embodiments disclosed herein is better critical dimension uniformity control. Conventional methods of patterning employ a single patterning process to simultaneously define the width and the length of a semiconductor feature. The resulting features formed using these conventional methods of patterning may suffer from undesirable large critical dimension variations due in part to loading effects, such as etching loading effects and/or photolithography loading effects. For example, a longer feature and a shorter feature may have different widths, even if their widths are designed to be the same. In other words, the longer feature and the shorter feature may end up having different critical dimensions, when they should have the same critical dimensions.

In comparison, two separate patterning processes are utilized to define the geometry of the contacts/vias 250-251 in the embodiments disclosed herein. The first patterning process defines the widths 114-115 of the contacts/vias 250-251, respectively. Thus, the widths 114-115 can be precisely defined without concerns regarding definition of the lengths of the contacts/vias 250-151. The second patterning process defines the lengths 170 and 171 of the contacts/vias 250-151, respectively. Thus, the lengths 170 and 171 can be precisely defined without concerns regarding definition of the widths of the contacts/vias 250-151. Consequently, the contacts/vias 250-151 have both precisely defined widths 114-115 and precisely defined lengths 170-171, respectively. Thus, the longer contact/via 250 has substantially the same width size as the shorter contact/via 251, thereby improving critical dimension uniformity.

Another advantage offered by the embodiments disclosed herein is reduced end-to-end spacing. Under conventional patterning processes, in order to shrink the width of a feature, its length is also shrunk. The amount of shrinkage is greater for the length than for the width. Thus especially for shorter features, the end-to-ends spacing is enlarged as a result of feature size shrinkage, which is undesirable.

In comparison, the end-to-end spacing (the distance 181) is substantially reduced due to the use of two separate patterning processes. As discussed above in association with FIGS. 6A and 6B, the length 171 of the contact/via 241 is defined by the second patterning process. As such, the end-to-end spacing is not affected by the width shrinkage. The end-to-end spacing here can be as small as allowed under the practical limitations of the second patterning process, thereby improving functional density of an IC chip.

It is understood that the trenches 110A-110H described above may be considered separate trenches or the same trench undergoing different fabrication processes. The same can be said for the trenches 111A-111H. It is also understood that additional processes may be performed to complete the fabrication of the semiconductor device 30. For the sake of simplicity, these additional processes are not described herein. Also, FIGS. 2-11 illustrate only one of several film schemes (for example, the use of the various layers 40-90) used to carry out the two separate patterning processes. It is understood that other embodiments may use different film schemes. These different film schemes are also not described in detail for the sake of simplicity.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a substrate;
   forming a first material layer over the substrate;
   forming a second material layer over the first material layer;
   performing a first patterning process to the second material layer to form an opening in the second material layer, the first patterning process defining a width size of the opening, the width size being measured in a first horizontal direction;
   performing a second patterning process to the opening to transform the opening, the second patterning process defining a length size of the transformed opening, the length size being measured in a second horizontal direction different from the first direction; and
   filling the transformed opening with a conductive material.

2. The method of claim 1, wherein the second horizontal direction is approximately perpendicular to the first horizontal direction.

3. The method of claim 1, wherein the second material layer includes a hard mask layer.

4. The method of claim 1, wherein the opening is a first trench, and wherein:
   the performing the first patterning process is carried out in a manner so that a second trench is formed in the second material layer, the second trench having approximately the same width size as the first trench and being spaced apart from the first trench in the second horizontal direction;
   the performing the second patterning process is carried out in a manner so that the second trench is transformed into a transformed second trench having a length size that is different from the length size of the first trench; and
   the filling the transformed trench includes filling the transformed second trench with the conductive material.

5. The method of claim 1, wherein the first and second patterning processes each include a photolithography process and an etching process.

6. The method of claim 1, wherein the filling the transformed opening is carried out so that the conductive material includes tungsten.

7. The method of claim 1, wherein the opening extends towards the substrate in a vertical direction.

8. A method, comprising:
   providing a substrate;
   forming a layer over the substrate;
   performing a first patterning process to the layer to form a trench in the layer, the first patterning process defining a first dimension of the trench, the first dimension being measured in a first direction;
   performing a second patterning process to the trench to transform the trench, the second patterning process defining a second dimension of the transformed trench, the second dimension being measured in a second direction different from the first direction, wherein the transformed trench extends towards the substrate in a third direction that is different from the first and second directions; and
   filling the transformed trench with a conductive material.

9. The method of claim 8, wherein the first, second, and third directions are approximately orthogonal with respect to one another.

10. The method of claim 8, wherein the first and second patterning processes each include a photolithography process followed by an etching process.

11. The method of claim 8, wherein the trench is a first trench, and wherein:
   the performing the first patterning process is carried out in a manner so that a second trench is formed in the layer, the second trench having approximately the same first dimension as the first trench and being spaced apart from the first trench in the second direction;
   the performing the second patterning process is carried out in a manner so that the second trench is transformed into a transformed second trench having a second dimension that is different from the second dimension of the first trench; and
   the filling the transformed trench includes filling the transformed second trench with the conductive material.

12. The method of claim 8, wherein the filling the transformed trench is carried out so that the conductive material includes tungsten.

13. The method of claim 8, wherein the layer contains a hard mask material.

14. The method of claim 8, wherein the layer includes a plurality of sub-layers that have different material compositions.

15. A method, comprising:
   providing a substrate;
   forming a material layer over the substrate;
   performing a first patterning process to the material layer to form a vertically-extending trench in the material layer, the first patterning process including a first photolithography process followed by a first etching process to define a width size of the trench, the width size being measured in a first horizontal direction;

performing a second patterning process to the trench to transform the trench, the second patterning process defining a length size of the transformed trench, the length size being measured in a second horizontal direction different from the first direction; and filling the transformed trench with a conductive material.

16. The method of claim 15, wherein the second horizontal direction is substantially orthogonal to the first horizontal direction.

17. The method of claim 15, wherein the trench is a first trench, and wherein the performing the first patterning process is carried out in a manner so that a second trench is formed in the material layer, the second trench having approximately the same width size as the first trench and being spaced apart from the first trench in the second horizontal direction.

18. The method of claim 17, wherein the performing the second patterning process is carried out in a manner so that the second trench is transformed into a transformed second trench having a length size that is different from the length size of the first trench; and the filling the transformed trench includes filling the transformed second trench with the conductive material.

19. The method of claim 15, wherein the filling the transformed trench is carried out so that the conductive material includes tungsten.

20. The method of claim 15, wherein the material layer contains a dielectric material.

* * * * *